(12) United States Patent
Lee et al.

(10) Patent No.: US 11,527,593 B2
(45) Date of Patent: Dec. 13, 2022

(54) BOTTOM ORGANIC LIGHT-EMITTING DISPLAY DEVICE INCLUDING RED COLOR FILTER OVERLAPPING OUT-COUPLING ENHANCING MEMBERS, AND MANUFACTURING METHOD THEREOF

(71) Applicant: LG Display Co., Ltd., Seoul (KR)

(72) Inventors: Seungbum Lee, Gimpo-si (KR); Wonrae Kim, Paju-si (KR); Jungmin Yoon, Goyang-si (KR); Sooin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 94 days.

(21) Appl. No.: 17/121,362

(22) Filed: Dec. 14, 2020

(65) Prior Publication Data
US 2021/0202636 A1    Jul. 1, 2021

(30) Foreign Application Priority Data
Dec. 30, 2019  (KR) .......................... 10-2019-0178076

(51) Int. Cl.
*H01L 27/32* (2006.01)
*H01L 51/56* (2006.01)

(52) U.S. Cl.
CPC ........ *H01L 27/3262* (2013.01); *H01L 27/322* (2013.01); *H01L 51/56* (2013.01); *H01L 2227/323* (2013.01); *H01L 2251/5307* (2013.01)

(58) Field of Classification Search
CPC .............. H01L 27/3262; H01L 27/322; H01L 51/5262; H01L 51/56; H01L 2227/323; H01L 2251/5307

USPC .......................................................... 257/40
See application file for complete search history.

(56) References Cited

U.S. PATENT DOCUMENTS

| 2006/0062270 | A1* | 3/2006 | Okutani | H01L 51/5268 372/64 |
| 2006/0164742 | A1* | 7/2006 | Katagami | H01L 27/322 359/895 |
| 2009/0195152 | A1* | 8/2009 | Sawano | H01L 27/322 313/506 |
| 2018/0083071 | A1* | 3/2018 | Kim | H01L 51/5262 |
| 2021/0408132 | A1* | 12/2021 | Han | H01L 51/5262 |

FOREIGN PATENT DOCUMENTS

| KR | 10-2017-0101088 A | 9/2017 | |
| KR | 10-2017-0114252 A | 10/2017 | |
| KR | 20210033233 A * | 3/2021 | ............ H01L 27/32 |

* cited by examiner

*Primary Examiner* — Matthew E. Gordon
(74) *Attorney, Agent, or Firm* — Birch, Stewart, Kolasch & Birch, LLP

(57) ABSTRACT

An organic light-emitting display device includes a substrate; a thin-film transistor layer disposed on the substrate, and including a thin-film transistor including a gate electrode, a source electrode, and a drain electrode; a color filter layer disposed on the thin-film transistor layer and including a red color filter, a green color filter, and a blue color filter; an organic light-emitting element disposed on the color filter layer; and a plurality of out-coupling enhancing members formed in the thin-film transistor layer, wherein the out-coupling enhancing members are spaced from each other at a predetermined spacing and each of the out-coupling enhancing members extends in a stripe shape, and the out-coupling enhancing members vertically overlap the red color filter.

15 Claims, 13 Drawing Sheets

Conventional device

Present device

Conventional device

Present device

FIG. 7

| Intensity(@590nm) | | | Spacing(nm) | | | | | | | | | | | | | | | | | | |
|---|---|---|---|---|---|---|---|---|---|---|---|---|---|---|---|---|---|---|---|---|---|
| Width(nm) | Height(nm) | Ref. | 200 | 250 | 300 | 350 | 400 | 450 | 490 | 500 | 510 | 550 | 600 | 650 | 700 | 750 | 800 | 850 | 900 | 950 | 1000 |
| Ref. | Ref. | 0.296 | | | | | | | | | | | | | | | | | | | |
| 190 | 450 | | | | | | | | | 0.270 | 0.284 | | | | | | | | | | |
| 200 | 100 | | 0.175 | 0.203 | 0.198 | 0.135 | 0.143 | 0.161 | | 0.186 | | | | | | | | | | | 0.190 |
| | 200 | | 0.180 | 0.216 | 0.230 | 0.270 | 0.229 | 0.238 | | 0.240 | | 0.174 | 0.228 | 0.234 | 0.252 | 0.235 | 0.243 | 0.256 | 0.254 | 0.255 | 0.280 |
| | 250 | | | | | | | | | 0.225 | | | | | | | | | | | |
| | 300 | | | | | | | | | 0.200 | | | | | | | | | | | |
| | 350 | | | | | | | | | 0.244 | | | | | | | | | | | |
| | 400 | | | | | | | | | 0.296 | | | | | | | | | | | |
| | 450 | | | | | | | | 0.270 | 0.264 | 0.263 | | | | | | | | | | |
| | 500 | | | | | | | | | 0.233 | | | | | | | | | | | |
| | 550 | | | | | | | | | 0.300 | | | | | | | | | | | |
| | 600 | | | | | | | | | 0.377 | | | | | | | | | | | |
| 210 | 450 | | | | | | | | 0.270 | 0.259 | | | | | | | | | | | |
| 250 | 450 | | | | | | | 0.267 | | 0.245 | | | | | | | | | | | |
| 300 | 450 | | | | | | | 0.247 | | | | | | | | | | | | | |
| 350 | 450 | | | | | | 0.240 | | | | | | | | | | | | | | |
| 400 | 450 | | | | | 0.151 | | 0.222 | | | | | | | | | | | | | |
| 450 | 250 | | | | | | | 0.152 | | | | | | | | | | | | | |
| | 300 | | | | | | | 0.132 | | | | | | | | | | | | | |
| | 350 | | | | | | | 0.232 | | | | | | | | | | | | | |
| | 400 | | | | 0.150 | 0.190 | 0.300 | 0.272 | | | | | | | | | | | | | |
| | 450 | | | | | | | | | 0.159 | | 0.170 | | | | | | | | | |

FIG. 8

| Intensity(@600nm) | | | Spacing(nm) | | | | | | | | | | | | | | | | | | |
|---|---|---|---|---|---|---|---|---|---|---|---|---|---|---|---|---|---|---|---|---|---|
| Width(nm) | Height(nm) | Ref. | 200 | 250 | 300 | 350 | 400 | 450 | 490 | 500 | 510 | 550 | 600 | 650 | 700 | 750 | 800 | 850 | 900 | 950 | 1000 |
| Ref. | Ref. | 0.253 | | | | | | | | | | | | | | | | | | | |
| 190 | 450 | | | | | | | | | 0.220 | 0.234 | | | | | | | | | | |
| 200 | 100 | | 0.123 | 0.148 | 0.143 | 0.153 | 0.128 | 0.161 | | 0.180 | | | | | | | | | | | 0.193 |
| 200 | 200 | | 0.179 | 0.212 | 0.257 | 0.270 | 0.226 | 0.185 | | 0.187 | | 0.179 | 0.174 | 0.222 | 0.256 | 0.270 | 0.169 | 0.180 | 0.213 | 0.215 | 0.206 |
| 200 | 250 | | | | | | | | | 0.164 | | | | | | | | | | | |
| 200 | 300 | | | | | | | | | 0.200 | | | | | | | | | | | |
| 200 | 350 | | | | | | | | | 0.250 | | | | | | | | | | | |
| 200 | 400 | | | | | | | | | 0.234 | | | | | | | | | | | |
| 200 | 450 | | | | | | | | 0.215 | 0.215 | 0.195 | | | | | | | | | | |
| 200 | 500 | | | | | | | | | 0.266 | | | | | | | | | | | |
| 200 | 550 | | | | | | | | | 0.326 | | | | | | | | | | | |
| 200 | 600 | | | | | | | | | 0.278 | | | | | | | | | | | |
| 210 | 450 | | | | | | | | 0.241 | 0.199 | | | | | | | | | | | |
| 250 | 450 | | | | | | | 0.245 | | 0.231 | | | | | | | | | | | |
| 300 | 450 | | | | | | | 0.232 | | | | | | | | | | | | | |
| 350 | 450 | | | | | | 0.226 | | | | | | | | | | | | | | |
| 400 | 450 | | | | | 0.146 | | | | | | | | | | | | | | | |
| 450 | 250 | | | | | | | 0.115 | | | | | | | | | | | | | |
| 450 | 300 | | | | | | | 0.106 | | | | | | | | | | | | | |
| 450 | 350 | | | | | | | 0.198 | | | | | | | | | | | | | |
| 450 | 400 | | | | | | | 0.249 | | | | | | | | | | | | | |
| 450 | 450 | | | | 0.140 | 0.114 | 0.181 | 0.182 | | 0.186 | | 0.175 | | | | | | | | | |

Distribution of field of veiw of conventional organic light-emitting display device Distribution of field of veiw of present organic light-emitting display device

BOTTOM ORGANIC LIGHT-EMITTING DISPLAY DEVICE INCLUDING RED COLOR FILTER OVERLAPPING OUT-COUPLING ENHANCING MEMBERS, AND MANUFACTURING METHOD THEREOF

CROSS-REFERENCE TO RELATED APPLICATION

This application claims the benefit under 35 U.S.C. § 119(a) of Korean Patent Application No. 10-2019-0178076 filed on Dec. 30, 2019 in the Korean Intellectual Property Office, the entire contents of which are hereby expressly incorporated herein by reference for all purposes into the present application.

BACKGROUND

1. Field

The present disclosure relates to an organic light-emitting display device having improved red luminance and high color reproduction capability, and a manufacturing method thereof.

2. Description of Related Art

Recently, a display field for visually presenting an electrical information signal has been rapidly developed. With the development of the display field, various display devices being thin, and light, and having low power consumption have been developed. Specific examples of such display devices include liquid crystal display devices (LCDs), plasma display panel devices (PDPs), field emission display devices (FEDs), organic light emitting display devices (OLEDs), and the like.

In particular, the organic light-emitting display device includes a self-emissive element referred to as an organic light-emitting element, and thus is excellent in terms of a response speed, light-emitting efficiency, color gamut, luminance, and a viewing angle, compared to other types of display devices. Such an organic light-emitting element can be applied as a light source in a lighting device as well as to the display device. Thus, lighting industry recently paid attention to the organic light-emitting element.

In particular, it is known that the organic light-emitting element is optimal compared to other types of light-emitting elements, for realizing a curved or flexible display device or lighting device, or a transparent display device or lighting device.

The organic light-emitting element has a basic structure in which an organic light-emitting layer is disposed between two electrodes. Electron and hole are injected into the organic light-emitting layer from the two electrodes, respectively, and then excitons are generated when the electrons and holes are combined with each other in the organic light-emitting layer. When the generated excitons change from an excited state to a ground state ground state, light is generated from the organic light-emitting element.

The organic light-emitting element is configured such that holes are injected from an anode to the organic light-emitting layer, and electrons are injected from a cathode to the organic light-emitting layer. In this connection, a recombination zone in which the electrons and the holes are combined with each other to generate excitons is formed within the organic light-emitting layer. Such an organic light-emitting element can act as a component of each of sub-pixels for emitting red (R), green (G), and blue (B) light beams, respectively. Here, the red sub-pixel has a red sub organic light-emitting element, the green sub-pixel has a green sub organic light-emitting element, and the blue sub-pixel has a blue sub organic light-emitting element. Thus, a pixel capable of realizing a full-color can be composed of the R, G, and B sub-pixels having the R, G, and B sub organic light-emitting elements, respectively.

However, a light beam of a color other than a pure color light beam as emitted from the organic light-emitting element can have energy loss due to a difference between refractive indexes inside and outside a display surface. Accordingly, the amount of light as emitted from the organic light-emitting element to the display surface can be reduced, so that color reproducibility can be deteriorated.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide an organic light-emitting display device having a structure to reduce extinction of long-wavelength light emitted from an organic light-emitting element due to total reflection, and provide a manufacturing method thereof.

In addition, another purpose of the present disclosure is to provide an organic light-emitting display device capable of maximizing out-coupling of long-wavelength light emitted from an organic light-emitting element via an out-coupling enhancing member having a fine pattern formed when forming a gate electrode or source/drain electrodes, without a separate process, and provide a manufacturing method thereof.

In addition, still another purpose of the present disclosure is to provide an organic light-emitting display device capable of improving red luminance and enabling high color reproduction using an out-coupling enhancing member formed in a red color filter region, and provide a manufacturing method thereof.

Purposes in accordance with the present disclosure are not limited to the above-mentioned purpose. Other purposes and advantages in accordance with the present disclosure as not mentioned above can be understood from following descriptions and more clearly understood from embodiments in accordance with the present disclosure. Further, it will be readily appreciated that the purposes and advantages in accordance with the present disclosure can be realized by features and combinations thereof as disclosed in the claims.

In an organic light-emitting display device and a manufacturing method thereof according to the present disclosure, a plurality of out-coupling enhancing members can be formed in a thin-film transistor layer, wherein the out-coupling enhancing members are spaced from each other at a predetermined spacing and each of the out-coupling enhancing members extends in a stripe shape, and the out-coupling enhancing members can be disposed in the red color filter region. Thus, long wavelength light such as red light can be out-coupled or totally reflected from a surface of the out-coupling enhancing members to reach a substrate surface without energy loss.

In addition, in the organic light-emitting display device and the manufacturing method thereof according to the present disclosure, the out-coupling enhancing members can be formed at the same time when forming the gate electrode or the source/drain electrodes, so that no additional process for formation of the out-coupling enhancing members is required, and thus, a manufacturing cost is not increased.

Further, in the organic light-emitting display device and the manufacturing method thereof according to the present disclosure, the gate electrode and the out-coupling enhancing member can be made of a copper meal, the source/drain electrodes and the out-coupling enhancing members can be made of a copper metal, or the gate electrode, the source/drain electrodes, and the out-coupling enhancing member can be made of copper metal. Thus, no additional process for formation of the out-coupling enhancing members is required, and thus, a manufacturing cost is not increased.

Effects and advantages in accordance with the present disclosure can be as follows but may not be limited thereto.

In the organic light-emitting display device and the manufacturing method thereof according to the present disclosure, extinction of long-wavelength light passing through the red color filter due to total internal reflection can be reduced to improve red luminance and enable high color reproduction.

In addition, in the organic light-emitting display device and the manufacturing method thereof according to the present disclosure, the out-coupling enhancing members can be formed at the same time when forming the gate electrode or the source/drain electrodes, so that no additional process for formation of the out-coupling enhancing members is required, and thus, a manufacturing cost is not increased, and a manufacturing process is simple.

Further, in the organic light-emitting display device and the manufacturing method thereof according to the present disclosure, the gate electrode and the out-coupling enhancing member can be made of a copper meal, the source/drain electrodes and the out-coupling enhancing members can be made of a copper metal, or the gate electrode, the source/drain electrodes, and the out-coupling enhancing member can be made of copper metal. Thus, no additional process for formation of the out-coupling enhancing members is required, and thus, a manufacturing cost is not increased and a manufacturing process is simple.

In addition to the effects as described above, specific effects in accordance with the present disclosure will be described together with the detailed description for carrying out the disclosure.

BRIEF DESCRIPTION OF DRAWINGS

FIG. 7 shows an integral value of red luminance based on a width, a height of an out-coupling enhancing member and a spacing between out-coupling enhancing members for a 590 nm light source.

FIG. 8 shows an integral value of red luminance based on a width, a height of an out-coupling enhancing member and a spacing between out-coupling enhancing members for a 600 nm light source.

DETAILED DESCRIPTION OF THE EMBODIMENTS

Figure 1:
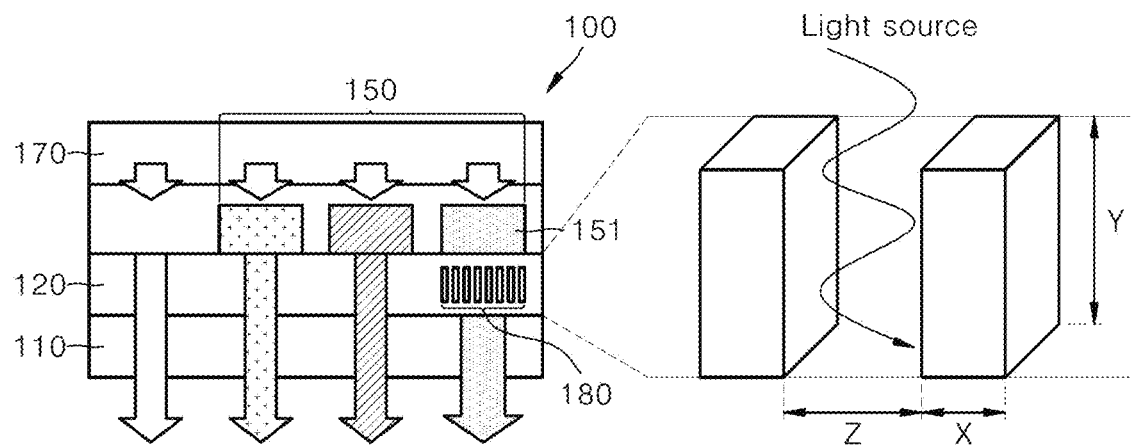
FIG. 1 schematically shows a cross-section of an organic light-emitting display device according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device and a manufacturing method thereof according to some embodiments of the present disclosure will be described. All components of the organic light-emitting display device according to all embodiments of the present disclosure are operatively coupled and configured.

In general, a structure of the organic light-emitting display device can be classified into a top emission structure and a bottom emission structure based on a light emission direction. FIG. 1 shows a region corresponding to one pixel, and one pixel includes regions corresponding to red, green, and blue sub-pixels, respectively.

Referring to FIG. 1, an organic light-emitting display device 100 includes a substrate 110 having a plurality of subpixel regions for displaying images'; a thin film transistor layer disposed on the substrate 100 and including a thin-film transistor 120 corresponding to each sub-pixel region, the thin-film transistor 120 including a gate electrode, a source electrode, and a drain electrode; a color filter layer 150 disposed on the thin-film transistor layer and corresponding to each sub-pixel region and including a red color filter, a green color filter, and a blue color filter; an organic light-emitting element 170 disposed on the color filter layer; and a plurality of out-coupling enhancing members 180 formed in the thin-film transistor layer, wherein the out-coupling enhancing members 180 are spaced from each other at a predetermined spacing and each of the out-coupling enhancing members extends in a stripe shape, wherein the out-coupling enhancing members 180 are formed in a region of a red color filter 151.

In particular, the organic light-emitting display device 100 according to the present disclosure includes the out-coupling enhancing members 180 intended to reduce extinction of long-wavelength light due to total internal reflection. The long-wavelength light can be obtained when white light emitted from the organic light-emitting element 170 passes through the red color filter.

Referring to FIG. 1, the plurality of out-coupling enhancing members 180 are spaced from each other at a predetermined spacing. Each of the out-coupling enhancing members 180 extends in a stripe shape. In this connection, each out-coupling enhancing member can have a width X, and a height Y, and the predetermined spacing between neighboring out-coupling enhancing members can be Z.

Figure 2:
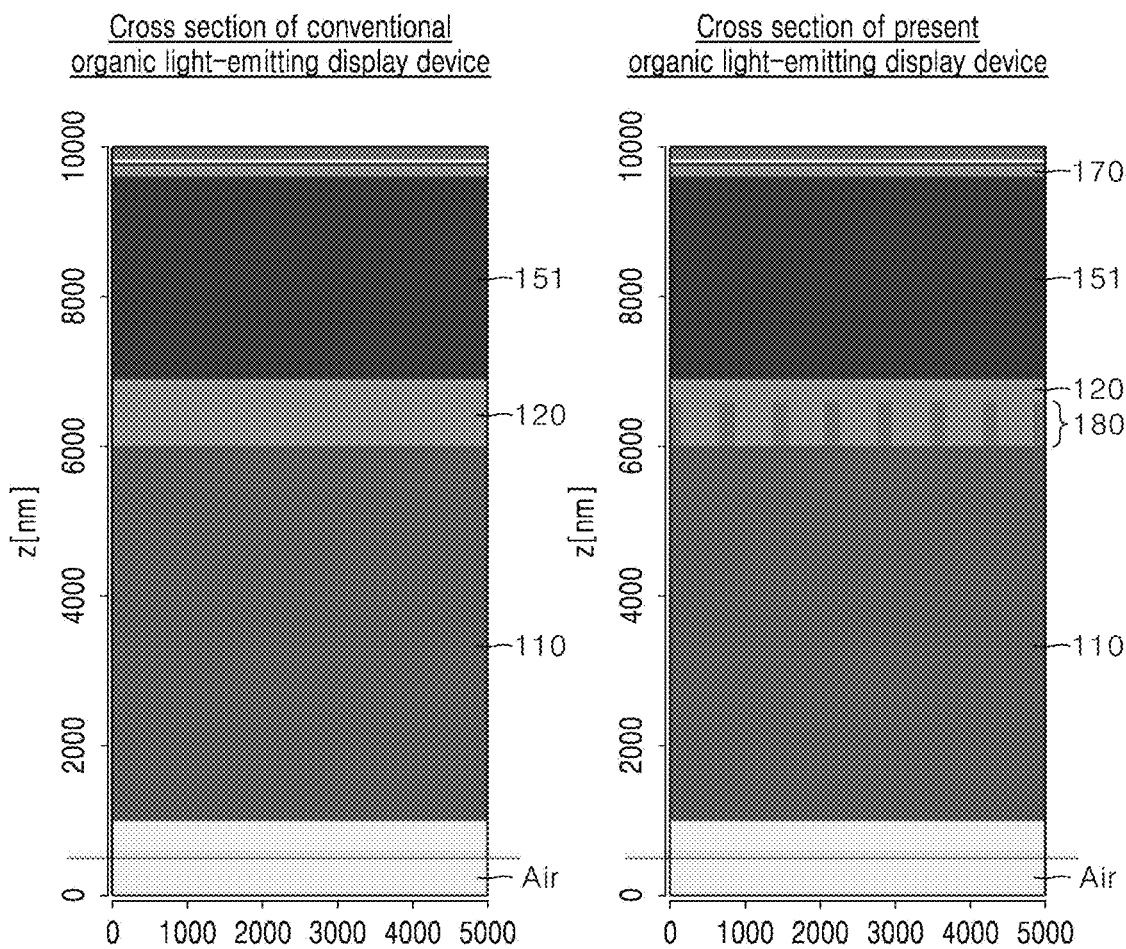
FIG. 2 schematically shows a cross section of each of a conventional organic light-emitting display device and an organic light-emitting display device according to an embodiment of the present disclosure.

More specifically, FIG. 2 shows a cross-section of a conventional organic light-emitting display device and a cross-section of an organic light-emitting display device according to an embodiment of the present disclosure.

Unlike the conventional organic light-emitting display devices, the organic light-emitting display device according to an example of the present disclosure ("present organic light-emitting display device" shown in FIG. 2) has the plurality of out-coupling enhancing members 180 formed in the thin-film transistor layer, wherein the out-coupling enhancing members 180 are spaced from each other at the predetermined spacing and each of the out-coupling enhancing members extends in a stripe shape, wherein the out-coupling enhancing members 180 are formed in a region of the red color filter 151.

Figure 3:
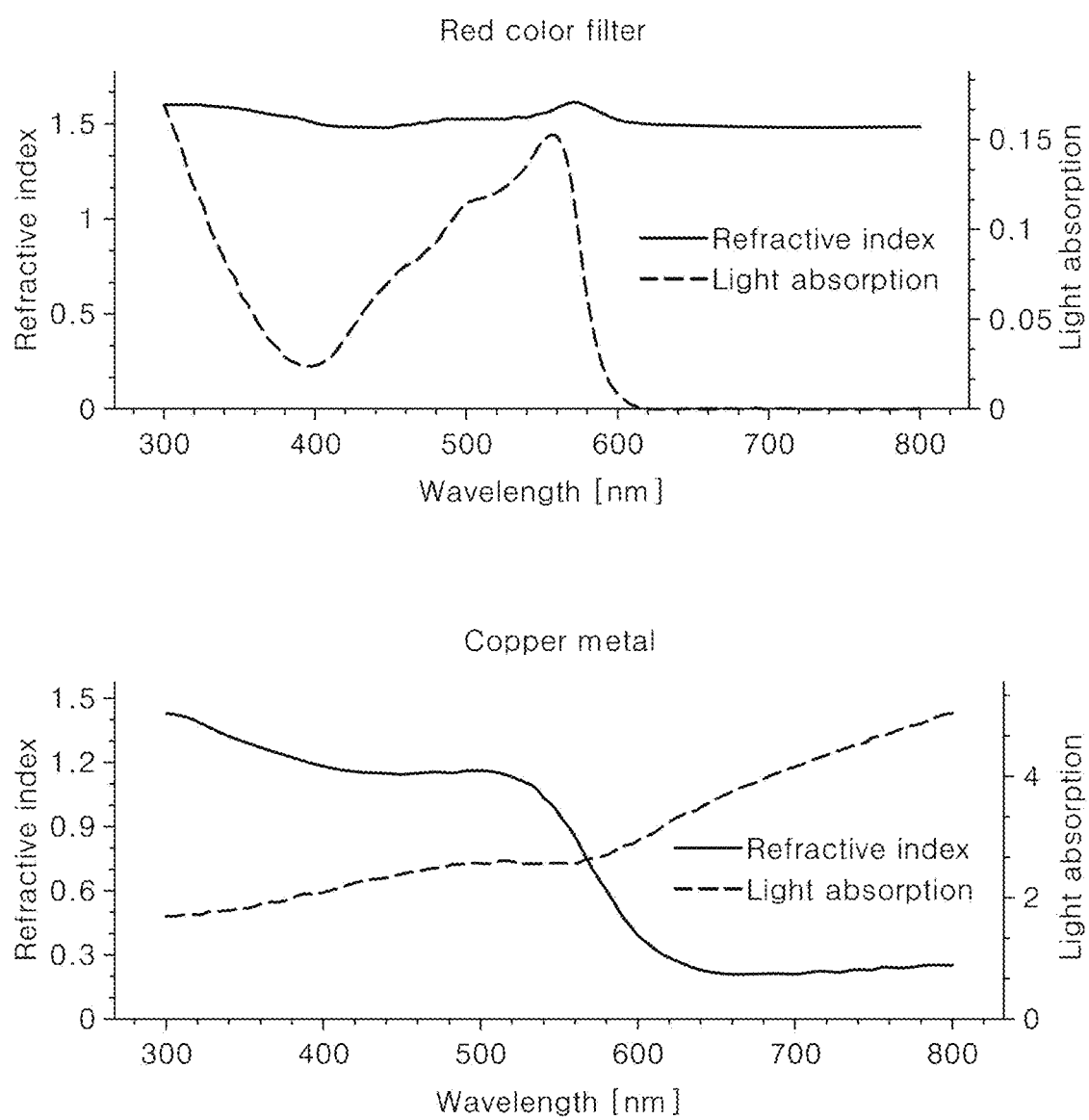
FIG. 3 shows a light absorption and a refractive index of each of a red color filter and a copper metal.

FIG. 3 shows a refractive index and a light absorption of each of a copper metal and a red color filter of the conventional organic light-emitting display device of FIG. 2. Referring to FIG. 3, it can be seen that the copper metal as the material of the out-coupling enhancing member has slightly increased light absorption, but has significantly lowered refractive index at a long wavelength of 580 nm or greater.

Figure 4:
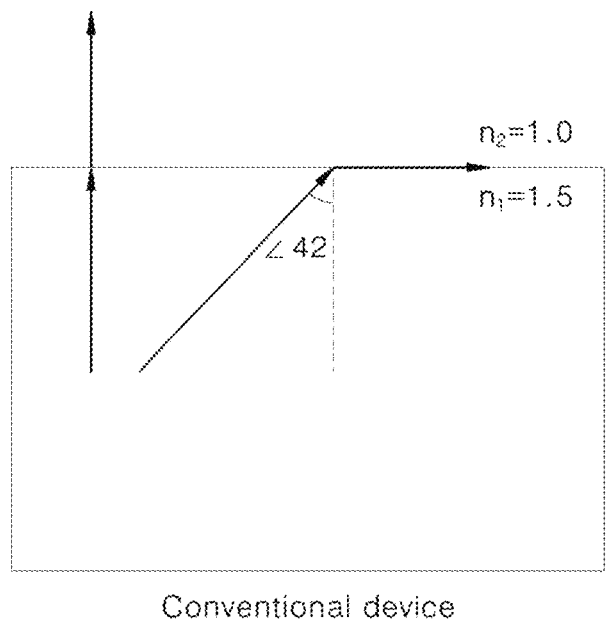
FIG. 4 shows an example of an optical path under absence or presence of an out-coupling enhancing member.
Figure 4:
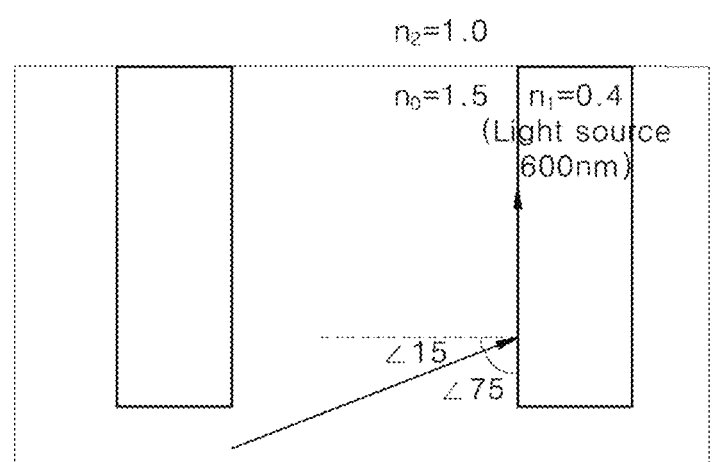

FIG. 4 shows an example of an optical path under absence or presence of the out-coupling enhancing member. Referring to FIG. 4, it can be seen that light efficiency of light emitted to an outside is determined based on a difference between refractive indexes around a substrate surface. In the conventional art ("conventional device" in FIG. 4), it can be seen that light is not emitted to the outside due to total internal reflection at an incidence angle of 42° or greater when the light travels from a denser medium to a less dense medium. In contrast, it can be confirmed that, according to the present disclosure ("present device" in FIG. 4), due to the out-coupling enhancing members (e.g., 180) having a low refractive index, light is emitted to the outside at an incidence angle from 15° to 75° without loss of energy via total reflection from the out-coupling enhancing members. Further, light at an incidence angle from 15° or smaller or at 75° can cause a surface plasmon resonance on the metal surface such that the out-coupling thereof can be realized along the metal surface.

Figure 5:
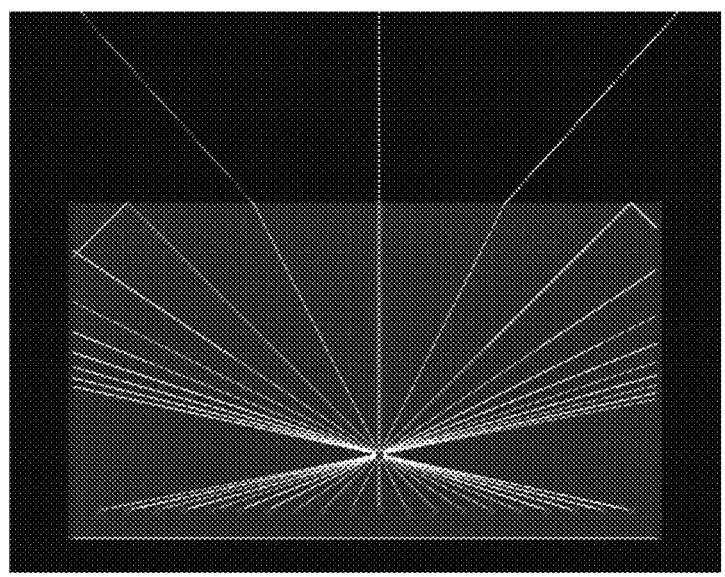
FIG. 5 schematically shows an optical path in a conventional display device and an optical path in a display device according to the present disclosure having an out-coupling enhancing member.
Figure 5:
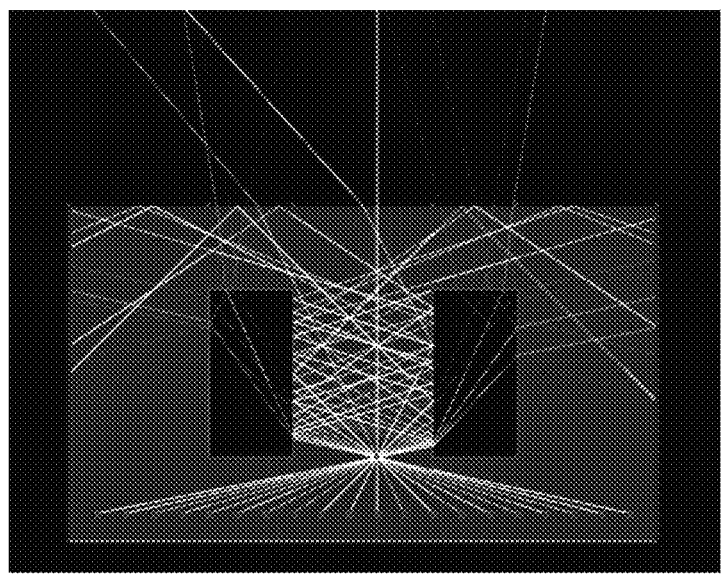

FIG. 5 schematically shows an optical path in a conventional display device and an optical path in a display device ("present device") according to the present disclosure having the out-coupling enhancing member. Referring to FIG. 5, it can be seen that total reflection and out-coupling of light can be improved due to the out-coupling enhancing members, thereby to improve light efficiency of light emitted to the outside.

Figure 6:
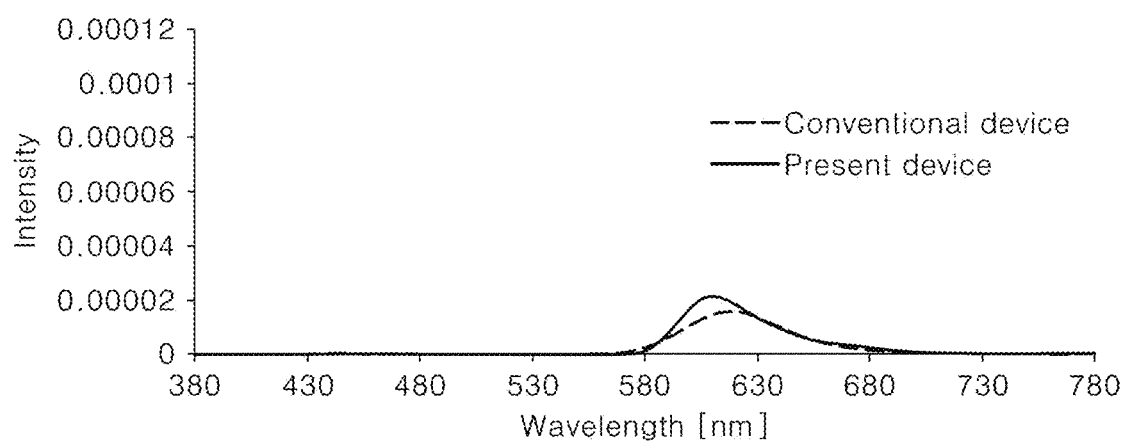
FIG. 6 shows spectral change of red light in each of a conventional organic light-emitting display device and an organic light-emitting display device according to the present disclosure.

FIG. 6 shows spectral change of red light in each of the conventional organic light-emitting display device and the organic light-emitting display device according to the present disclosure.

Referring to FIG. 6, it can be seen that the organic light-emitting display device according to the present disclosure has luminance of red light increased by about 21% due to the out-coupling enhancing member, compared to that of the conventional organic light-emitting display device. More specifically, in the organic light-emitting display device according to the present disclosure, DCI (digital cinema initiative) coverage as a standard of digital cinema system increases by 2%, compared to that of the conventional organic light-emitting display device. Further, in the organic light-emitting display device according to the present disclosure, BT2020 coverage as a 4K/UHD standard as recommended by ITU as an international broadcasting standard organization increases by 2%, compared to that of the conventional organic light-emitting display device.

Referring to FIG. 1, the plurality of out-coupling enhancing members 180 are spaced from each other at the predetermined spacing. Each out-coupling enhancing member 180 extends in a stripe pattern. In this connection, each out-coupling enhancing member can have a width X, a height Y, and the predetermined spacing between neighboring out-coupling enhancing members can be Z. The width X of each out-coupling enhancing member can be 0.3 μm or smaller, preferably 0.2 μm or smaller. Further, the height Y of each out-coupling enhancing member can be in a range of 0.4 μm to 0.6 μm. Further, the predetermined spacing Z between neighboring out-coupling enhancing members can be in a range of 0.2 μm to 1 μm.

More specifically, FIG. 7 shows an integral value of red light spectrum based on the width and the height of the out-coupling enhancing member and the predetermined spacing between neighboring out-coupling enhancing members for a 590 nm light source. FIG. 8 shows an integral value of red light spectrum based on the width and the height of the out-coupling enhancing member and the predetermined spacing between neighboring out-coupling enhancing members for a 600 nm light source. Referring to FIGS. 7 and 8, it can be seen that the red light is optimized at a width of 0.2 μm, a height of 0.45 μm to 0.6 μm, and a spacing of 0.5 μm for the long wavelength 590 nm and 600 nm light sources.

Figure 9:
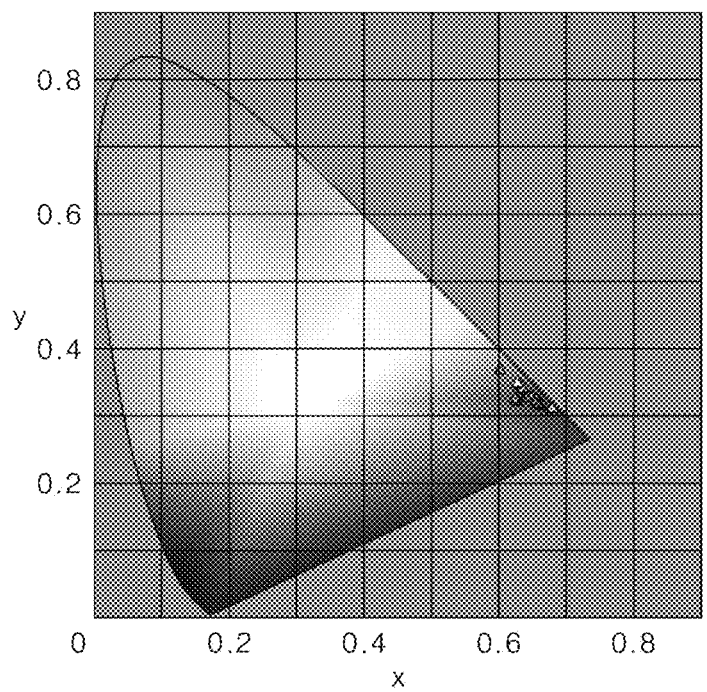
FIG. 9 is a CIE1931 color distribution diagram showing a color gamut of the conventional organic light-emitting display device and the organic light-emitting display device according to the present disclosure.
Figure 9:
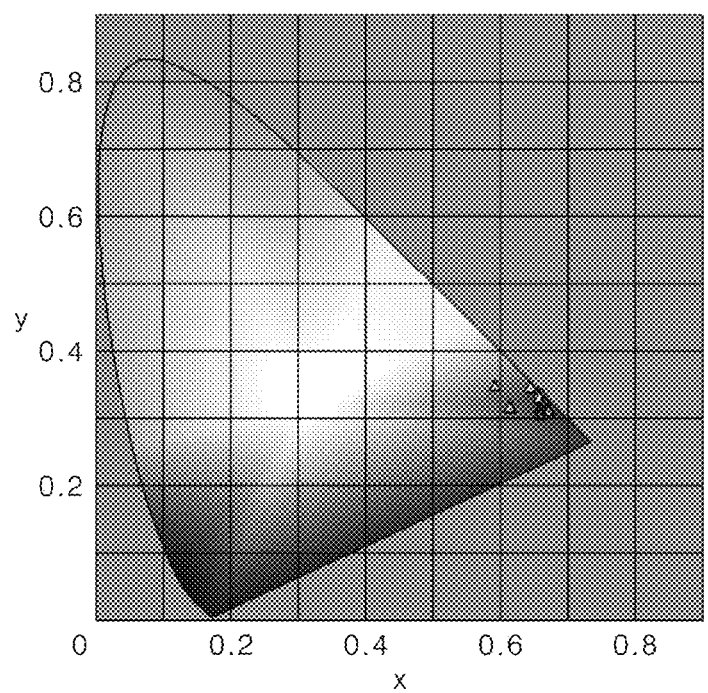

FIG. 9 is a CIE1931 color distribution diagram showing a color gamut of each of the conventional organic light-emitting display device and the organic light-emitting display device according to the present disclosure. Referring to FIG. 9, the organic display device according to the present disclosure can have luminance of red light as increased by 20% or more and can have optimized color purity.

Figure 10:
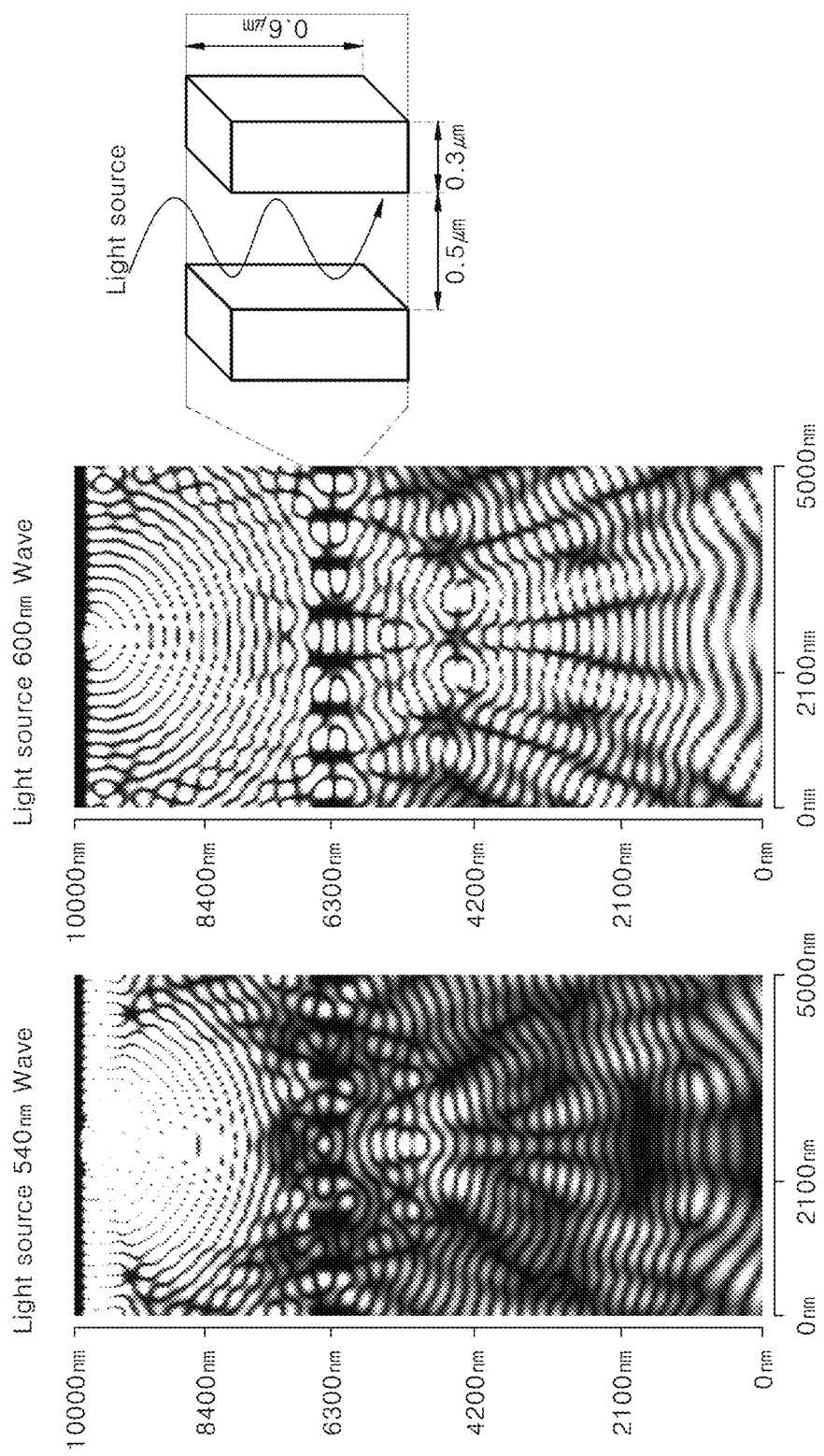
FIG. 10 shows an out-coupling effect of light through a red color filter of an organic light-emitting display device according to an embodiment of the present disclosure for 540 nm and 600 nm light sources.

FIG. 10 shows an out-coupling effect of light through a red color filter of an organic light-emitting display device according to an embodiment of the present disclosure for 540 nm and 600 nm light sources.

Referring to FIG. 10, it can be seen that the out-coupling effect due to the out-coupling enhancing member is insufficient at the 540 nm light source, but the out-coupling effect due to the out-coupling enhancing member is maximized at the 600 nm light source. For example, it can be seen that the out-coupling effect due to the out-coupling enhancing member in accordance with the present disclosure can be maximized for the long wavelength 600 nm light source and thus the red light luminance can be improved.

Figure 11:
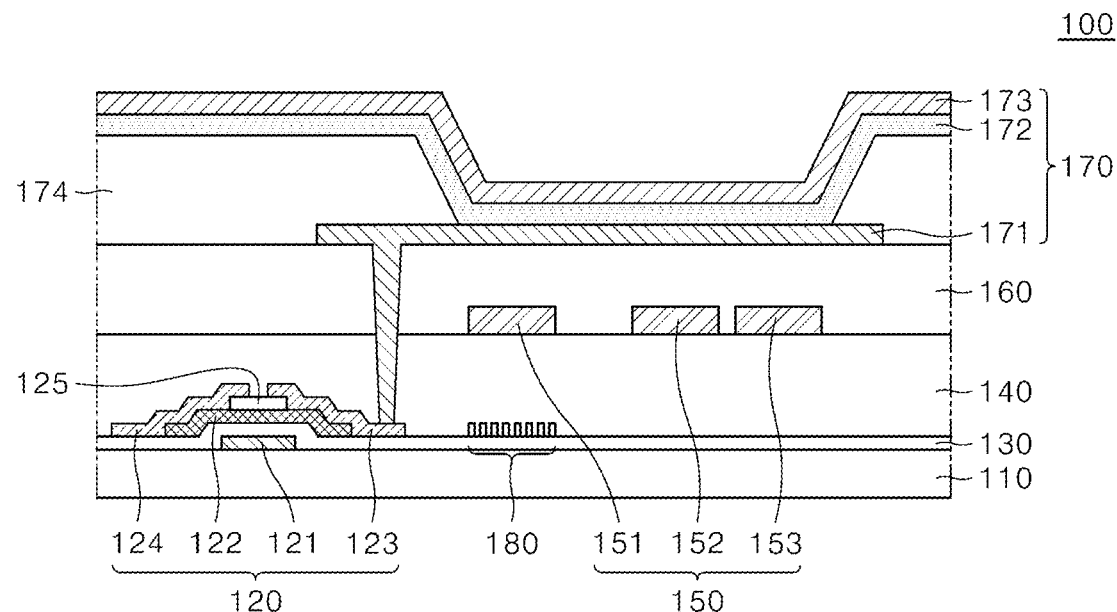
FIG. 11 schematically shows that an out-coupling enhancing member is flush with source/drain electrodes and is formed in a red color filter region.
Figure 12:
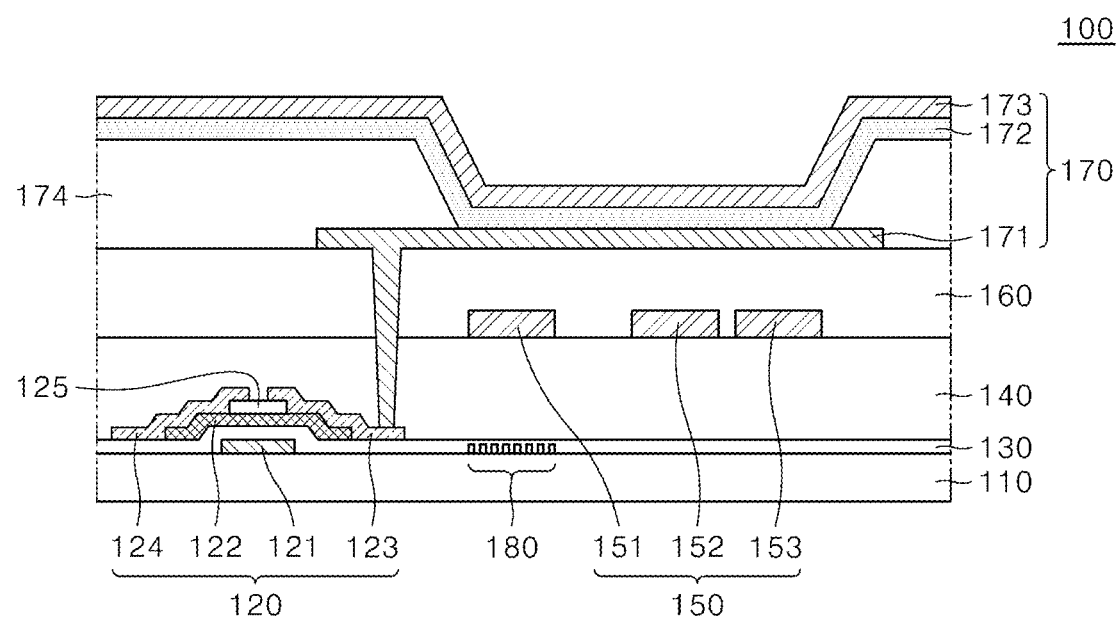
FIG. 12 schematically shows that an out-coupling enhancing member is flush with a gate electrode and is formed in a red color filter region.

FIG. 11 schematically shows that an out-coupling enhancing member is flush with source/drain electrodes and is formed in a red color filter region according to an example of the present disclosure. FIG. 12 schematically shows that an out-coupling enhancing member is flush with a gate electrode and is formed in a red color filter region according to an example of the present disclosure.

Referring to FIG. 11, the out-coupling enhancing member 180 can be flush with the source electrode 123 and the drain electrode 124 on the substrate 110. Further, referring to another example as shown in FIG. 12, the out-coupling enhancing member 180 can be flush with the gate electrode 121 on the substrate 110. Here, only as an example, the term 'flush' can include a meaning of being coplanar, but is not limited thereto. For example, a top surface of the out-coupling enhancing member 180 can be coplanar or aligned with a top surface of the source electrode 123 and/or a top surface of the drain electrode 124, or a top surface of the gate electrode 121.

The substrate 110 in FIG. 11 and FIG. 12 can be made of a material such as glass or plastic. In particular, in the organic light-emitting display device having a bottom light-emitting structure, the substrate 110 is preferably made of a transparent material such that light passing through the color filter layer 150 is emitted through the substrate to an outside.

Further, the substrate 110 can be embodied as a substrate for a thin-film transistor, and the thin-film transistor layer can be formed on an inner face of the substrate 110 facing the organic light-emitting layer 170.

Specifically, a gate electrode 121 is positioned on the substrate 110, and a gate insulating layer 130 for insulating between the gate electrode 121 and an active layer 122 is positioned on the substrate 110 and the gate electrode 121.

Further, the active layer 122 and an etch stopper 125 are disposed on the gate insulating layer 130. A source electrode 123 and a drain electrode 124 are positioned on the active layer 122 and the etch stopper 125.

The source electrode 123 and the drain electrode 124 are electrically connected to the active layer 122 in a contact manner with the active layer 122, and occupy a partial region on the etch stopper 125.

Herein, only a driving thin-film transistor among various thin-film transistors that can be included in the organic light-emitting display device 100 is shown for convenience of illustration. Further, although an example in which the thin-film transistor 120 has an inverted staggered structure is described herein, a thin-film transistor having a coplanar structure can be used.

Subsequently, a protective layer 140 is positioned on the thin-film transistor 120, and the color filter layer 150 is positioned on the protective layer 140. The color filter layer 150 is configured for changing a color of white light emitted from the organic light-emitting element 170 and includes a red color filter 151, a blue color filter 152, and a green color filter 153. In this connection, the red color filter 151, the blue color filter 152 and the green color filter 153 are located in regions corresponding to red, blue, and green sub-pixels, respectively.

Further, the color filter layer 150 is located in a region corresponding to a light-emitting region and on the protective layer 140. In this connection, the light-emitting region can mean a region in which the organic light-emitting layer 172 emits light.

Short-wavelength light of the white light emitted from the organic light-emitting layer 172 is absorbed into the red color filter and thus is extinguished while passing through the red color filter, and light of a long-wavelength band corresponding to a red color passes through the red color filter.

In this connection, the out-coupling enhancing members 180 are located in a region of the red color filter 151 to maximize the out-coupling of the light of the long wavelength band that has passed through the red color filter, thereby to reduce extinction thereof due to total internal reflection.

More specifically, in the region of the red color filter 151, the out-coupling enhancing members 180 can be flush with the gate electrode 121 on the substrate or can be flush with the source electrode 123 and the drain electrode 124 on the substrate.

Further, the out-coupling enhancing member 180 can be made of aluminum, copper, chromium, titanium, molybdenum, or tungsten, preferably the copper metal.

In general, the gate electrode 121, the source electrode 123 and the drain electrode 124 are made of the copper metal. In this connection, when the gate electrode 121 is formed or when the source electrode 123 and the drain electrode 124 are formed, the out-coupling enhancing members 180 made of the copper metal as the same material as the gate electrode 121 or the source electrode 123 and the drain electrode 124 is formed. Thus, the device can be efficiently manufactured without a separate process for the formation of the out-coupling enhancing members 180.

A planarization layer 160 can be located on the protective layer 140. The planarization layer 160 can mitigate or eliminate a step between the protective layer 140 and the color filter layer 150. Accordingly, the planarization layer 160 can have a flat top surface and thus serve to prevent a short circuit of a first electrode 171 and/or a second electrode 173 of the organic light-emitting element 170 provided on the planarization layer 160

The planarization layer 160 can be made of, for example, acrylic resin, phenol resin, polyimide based resin, polyamide based resin, unsaturated polyester based resin, polyphenylene based resin, polyphenylene sulfide based resin, benzocyclobutene or photoresist.

The organic light-emitting element 170 for emitting white light and a bank layer 174 for partitioning the light-emitting region can be located on the planarization layer 160.

In this connection, the organic light-emitting element 170 is located on the planarization layer 160, and include a first electrode 171 electrically connected to the thin-film transistor, an organic light-emitting layer 172 positioned on the first electrode 171 for emitting white light, and a second electrode 173 formed on the organic light-emitting layer 172 and acting as a reflective cathode.

The first electrode 171 is preferably made of a transparent conductive oxide so that light emitted from the organic light-emitting layer 172 can be emitted therethrough downward. A material of the first electrode 171 can include a transparent conductive oxide such as ITO (Indium Tin Oxide), IZO (Indium Zinc Oxide), AZO (Aluminum Zinc Oxide), GZO (Gallium doped Zinc Oxide), ZTO (Zinc Tin Oxide), GTO (Gallium Tin Oxide), or FTO (Fluorine doped Tin Oxide).

In one example, the second electrode 173 can be made of a reflective metal or an alloy thereof such as Mo, MoW, Cr, Ag, APC (Ag—Pd—Cu alloy), Al or Al alloy so that light emitted from the organic light-emitting layer 172 is reflected therefrom downwardly. Alternatively, the second electrode 173 can has a structure in which a reflective film made of a reflective metal or an alloy thereof is coated on a transparent conductive oxide layer.

The organic light-emitting element 170 can include a stack of a hole transport layer, a hole injection layer, the light-emitting material layer 172, an electron injection layer and an electron transport layer in this order on the first electrode 171.

Figure 13:
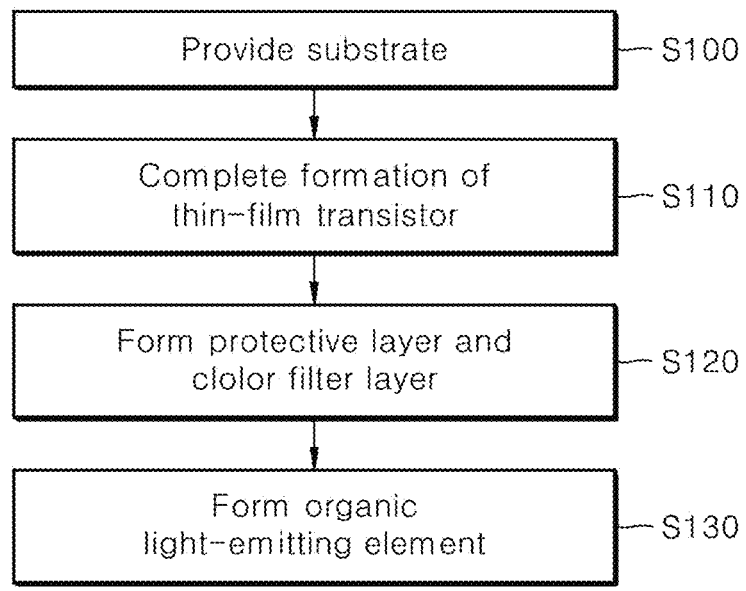
FIG. 13 is a flowchart showing a method of manufacturing an organic light-emitting display device according to an embodiment of the present disclosure.

FIG. 13 is a flowchart showing a method of manufacturing an organic light-emitting display device according to an embodiment of the present disclosure.

Referring to FIG. 13, the manufacturing method of the organic light-emitting display device according to the present disclosure can include a step S100 of providing the substrate, a step 110 in which the thin-film transistor is formed on the substrate, the thin-film transistor including the gate electrode, the source electrode, and the drain electrode and corresponding to each sub-pixel region, and the out-coupling enhancing members spaced from each other and extending in a stripe pattern are formed on the substrate, a step 120 in which the protective layer is formed on the thin-film transistor and the out-coupling enhancing members, and the color filter layer is formed on the protective layer in each sub-pixel region, the color filter layer including the red color filter, the green color filter, and the blue color filter, and a step 130 of forming the organic light-emitting element on the color filter layer. In this connection, the out-coupling enhancing members are located in the red color filter region.

First, in the step S100 of providing the substrate, the substrate 110 can be made of a material such as glass or plastic. In particular, in the organic light-emitting display device having a bottom light-emitting structure, the substrate 110 is preferably made of a transparent material such that light passing through the color filter layer 150 is emitted through the substrate to an outside.

Next, the thin-film transistor is formed on the provided substrate and the out-coupling enhancing members spaced from each other and extending in a stripe pattern are formed on the substrate (S110).

In particular, in the manufacturing method of the organic light-emitting display device according to the present disclosure, the out-coupling enhancing members are formed in the red color filter region at the same time when the thin-film transistor is formed.

Figure 14:
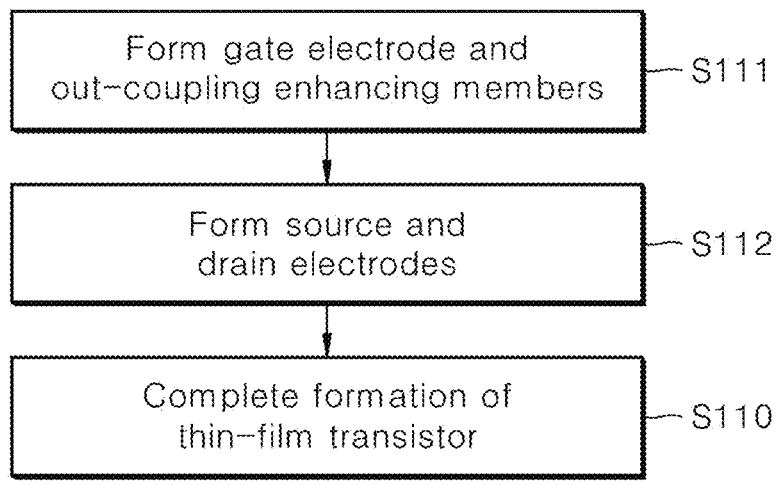
FIG. 14 is a flow chart showing a manufacturing method of a thin-film transistor layer formed on the substrate where the out-coupling enhancing member is flush with the gate electrode.

For example, referring to FIG. 14, at the same time when forming the gate electrode on the substrate, the plurality of out-coupling enhancing members can be formed thereon such that the plurality of out-coupling enhancing members are flush with the gate electrode (S111). Thereafter, the source electrode and the drain electrode can be formed (S112).

Figure 15:
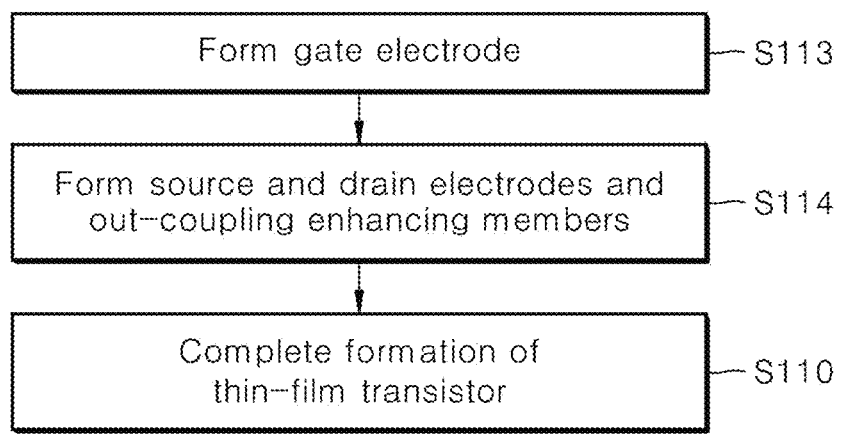
FIG. 15 is a flow chart showing a manufacturing method of a thin-film transistor layer formed on the substrate where the out-coupling enhancing member is flush with the source/drain electrodes.

In another example, referring to FIG. 15, the gate electrode can be formed on the substrate (S113). Then, the source/drain electrodes and the plurality of out-coupling enhancing members can be formed at the same time such that the out-coupling enhancing members are flush with the source/drain electrodes (S114).

In this connection, the width of each out-coupling enhancing member can be 0.3 μm or smaller, and preferably 0.2 μm or smaller. Further, the height of each out-coupling enhancing member can be 0.4 μm to 0.6 μm. Further, the predetermined spacing between neighboring out-coupling enhancing members can be 0.2 μm to 1 μm.

Further, the out-coupling enhancing member can be made of aluminum, copper, chromium, titanium, molybdenum or tungsten metal, preferably, the copper metal. In general, the gate electrode 121, the source electrode 123 and the drain electrode 124 are made of the copper metal. In this connection, when the gate electrode 121 is formed or when the source electrode 123 and the drain electrode 124 are formed, the out-coupling enhancing members 180 made of the copper metal as the same material as the gate electrode 121 or the source electrode 123 and the drain electrode 124 is formed. Thus, the device can be efficiently manufactured without a separate process for the formation of the out-coupling enhancing members 180.

The protective layer 140 can be formed on the transistor 120 and the out-coupling enhancing members 180 and the color filter layer 150 can be formed on the protective layer 140 (S120).

The planarization layer 160 can be formed on the protective layer 140. The planarization layer 160 can mitigate or eliminate a step between the protective layer 140 and the color filter layer 150. Accordingly, the planarization layer 160 can have a flat top surface and thus serve to prevent a short circuit of the first electrode 171 and/or the second electrode 173 of the organic light-emitting element 170 provided on the planarization layer 160

The planarization layer 160 can be made of, for example, acrylic resin, phenol resin, polyimide based resin, polyamide based resin, unsaturated polyester based resin, polyphenylene based resin, polyphenylene sulfide based resin, benzocyclobutene or photoresist.

Figure 16:
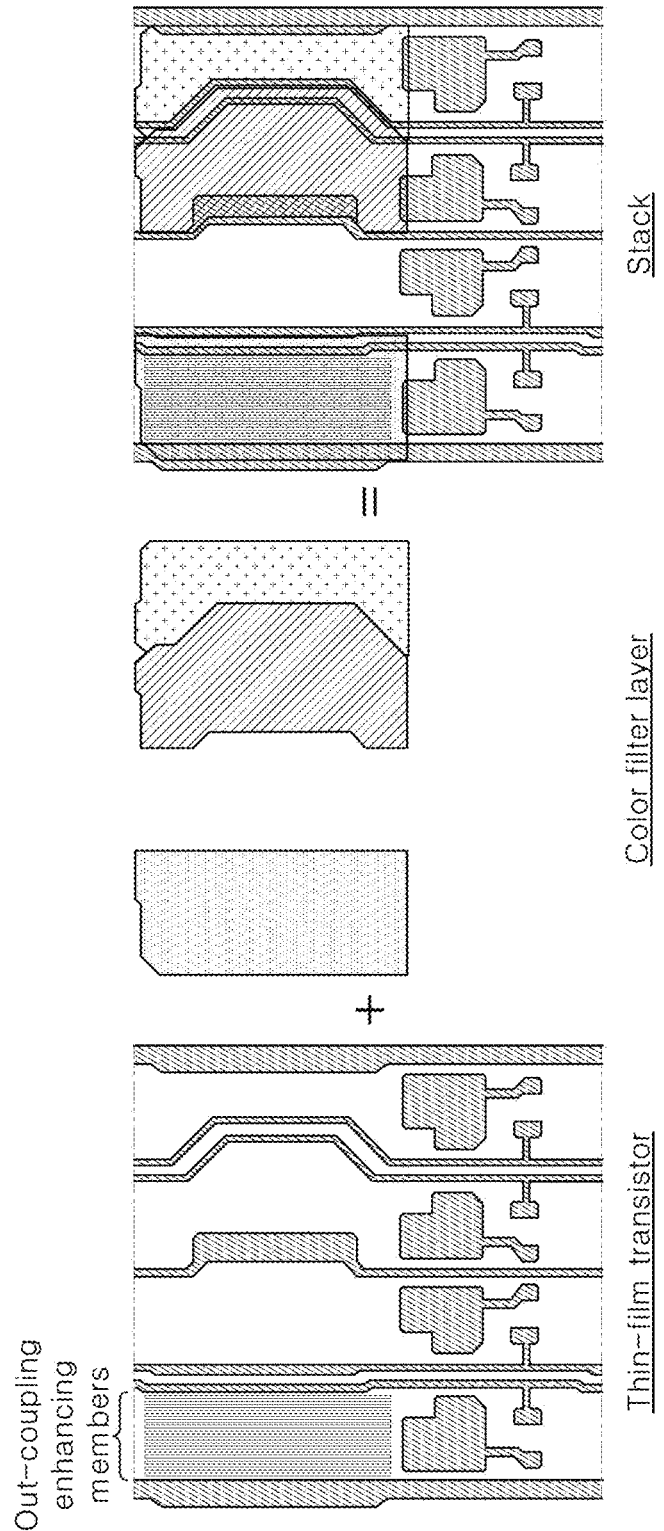
FIG. 16 schematically shows a combination between the thin-film transistor layer containing therein the out-coupling enhancing member and the color filter layer.

In this connection, referring to FIG. 16, the red color filter can vertically overlap the plurality of out-coupling enhancing members 180.

Next, the organic light-emitting element can be formed on the planarization layer 160 (S130).

In this connection, the organic light-emitting element 170 includes the first electrode 171 electrically connected to the thin-film transistor, the organic light-emitting layer 172 positioned on the first electrode 171 for emitting white light, and the second electrode 173 formed on the organic light-emitting layer 172 and acting as a reflective cathode.

The first electrode 171 is preferably made of a transparent conductive oxide so that light emitted from the organic light-emitting layer 172 can be emitted therethrough downward. A material of the first electrode 171 can include a transparent conductive oxide such as ITO (Indium Tin Oxide), IZO (Indium Zinc Oxide), AZO (Aluminum Zinc Oxide), GZO (Gallium doped Zinc Oxide), ZTO (Zinc Tin Oxide), GTO (Gallium Tin Oxide), or FTO (Fluorine doped Tin Oxide).

In one example, the second electrode 173 can be made of a reflective metal or an alloy thereof such as Mo, MoW, Cr, Ag, APC (Ag—Pd—Cu alloy), Al or Al alloy so that light emitted from the organic light-emitting layer 172 is reflected therefrom downwardly. Alternatively, the second electrode 173 can has a structure in which a reflective film made of a reflective metal or an alloy thereof is coated on a transparent conductive oxide layer.

The organic light-emitting element 170 can include a stack of a hole transport layer, a hole injection layer, the light-emitting material layer 172, an electron injection layer and an electron transport layer in this order on the first electrode 171.

It will be understood that although the above disclosure has been described with reference to the preferred embodiment of the present disclosure, those skilled in the art can achieve modifications and changes thereto within a range that does not deviate from the spirit and region of the present disclosure as described in the following claims.

What is claimed is:

1. An organic light-emitting display device comprising:
   a thin-film transistor layer disposed on a substrate, and including a thin-film transistor corresponding to each of a plurality of sub-pixel regions, the thin-film transistor including a gate electrode, a source electrode, and a drain electrode;
   a color filter layer disposed on the thin-film transistor layer and corresponding to each sub-pixel region, the color filter layer including a red color filter, a green color filter, and a blue color filter;
   an organic light-emitting element disposed on the color filter layer; and
   a plurality of out-coupling enhancing members formed in the thin-film transistor layer,
   wherein the plurality of out-coupling enhancing members are spaced from each other at a predetermined spacing and each of the plurality of out-coupling enhancing members extends in a stripe shape, and
   wherein the plurality of out-coupling enhancing members vertically overlap the red color filter.

2. The organic light-emitting display device of claim 1, wherein each of the plurality of out-coupling enhancing members is made of a copper metal.

3. The organic light-emitting display device of claim 1, wherein each of the plurality of out-coupling enhancing members has a width of approximately 0.3 μm or smaller, and a height of approximately 0.4 μm to 0.6 μm, and the predetermined spacing is in a range of approximately 0.2 μm to 1 μm.

4. The organic light-emitting display device of claim 1, wherein the plurality of out-coupling enhancing members are flush with the gate electrode on the substrate.

5. The organic light-emitting display device of claim 1, wherein the plurality of out-coupling enhancing members are flush with the source electrode and the drain electrode on the substrate.

6. The organic light-emitting display device of claim 4, wherein the plurality of out-coupling enhancing members and the gate electrode are made of a copper metal.

7. The organic light-emitting display device of claim 5, wherein the out-coupling enhancing members and the source electrode and the drain electrode are made of a copper metal.

8. The organic light-emitting display device of claim 1, wherein the organic light-emitting display device has a bottom light-emitting structure in which light from the organic light-emitting element is emitted toward the substrate.

9. A method for manufacturing an organic light-emitting display device, the method comprising:
- providing a thin-film transistor corresponding to each of a plurality of sub-pixel regions on a substrate, and providing a plurality of out-coupling enhancing members on the substrate,
- wherein the thin-film transistor includes a gate electrode, a source electrode, and a drain electrode, and
- wherein the plurality of out-coupling enhancing members are spaced from each other at a predetermined spacing and each of the plurality of out-coupling enhancing members extends in a stripe shape;
- providing a protective layer on the substrate to cover the thin-film transistor and the plurality of out-coupling enhancing members;
- providing a red color filter, a green color filter, and a blue color filter on the protective layer;
- covering the red color filter, the green color filter, and the blue color filter with a planarization layer; and
- providing an organic light-emitting element on the planarization layer,
- wherein the plurality of out-coupling enhancing members vertically overlap the red color filter.

10. The method of claim 9, wherein each of the plurality of out-coupling enhancing members is made of a copper metal.

11. The method of claim 9, wherein each of the plurality of out-coupling enhancing members has a width of approximately 0.3 μm or smaller, and a height of approximately 0.4 μm to 0.6 μm, and the predetermined spacing is in a range of approximately 0.2 μm to 1 μm.

12. The method of claim 9, wherein the gate electrode and the plurality of out-coupling enhancing members are formed at a same time.

13. The method of claim 9, wherein the source electrode, the drain electrode, and the plurality of out-coupling enhancing members are formed at a same time.

14. The method of claim 12, wherein the gate electrode and the plurality of out-coupling enhancing members are made of a copper metal.

15. The method of claim 13, wherein the source electrode, the drain electrode and the plurality of out-coupling enhancing members are made of a copper metal.

* * * * *